United States Patent
Anderson et al.

(10) Patent No.: US 9,642,290 B2
(45) Date of Patent: May 2, 2017

(54) ELECTROMAGNETICALLY PROTECTED ELECTRONIC ENCLOSURE

(71) Applicant: Emprimus, LLC, St. Louis Park, MN (US)

(72) Inventors: George Anderson, Champlin, MN (US); William M. Volna, Minneapolis, MN (US); Greg Fuchs, River Falls, WI (US); David Blake Jackson, Excelsior, MN (US); Wallace Jensen, Centerville, MN (US); James Nicholas Ruehl, Excelsior, MN (US); Gale K. Nordling, Excelsior, MN (US); Frederick R. Faxvog, Long Lake, MN (US)

(73) Assignee: Emprimus, LLC, St. Louis Park, MN (US)

( * ) Notice: Subject to any disclaimer, the term of this patent is extended or adjusted under 35 U.S.C. 154(b) by 552 days.

(21) Appl. No.: 14/209,694

(22) Filed: Mar. 13, 2014

(65) Prior Publication Data
US 2016/0302332 A1    Oct. 13, 2016

Related U.S. Application Data

(60) Provisional application No. 61/784,891, filed on Mar. 14, 2013.

(51) Int. Cl.
*H05K 9/00*      (2006.01)
*H05K 5/02*      (2006.01)

(52) U.S. Cl.
CPC ......... *H05K 9/0049* (2013.01); *H05K 5/0221* (2013.01); *H05K 5/0226* (2013.01); *H05K 9/0015* (2013.01)

(58) Field of Classification Search
CPC .................................................. H05K 9/0015
See application file for complete search history.

(56) References Cited

U.S. PATENT DOCUMENTS 2,727,225 A    7/1956   Dunn
2,757,225 A    7/1956   Dunn
(Continued)

FOREIGN PATENT DOCUMENTS

CA          1277870 C     12/1990
EP      0 668 692 A1     8/1995
(Continued)

OTHER PUBLICATIONS

Military Handbook 235-1B, Electromagnetic (Radiated) Environment Considerations for Design and Procurement of Electrical and Electronic Equipment, Subsystems and Systems, Part 1B, General Guidance, 20 Pages, 1993.
(Continued)

*Primary Examiner* — Hung V Ngo
(74) *Attorney, Agent, or Firm* — Merchant & Gould P.C.

(57) ABSTRACT

Methods and devices for shielding electronic equipment within an enclosure are disclosed. One method includes positioning electronic equipment within an interior volume of a shielding enclosure having an opening providing access to the interior volume, the opening surrounded by an enclosure frame. The method further includes closing a door to the shielding enclosure, thereby closing off the opening, and engaging one or more latches to affix the door in a closed position, the door including a shielding curtain positioned across the opening. The method also includes inflating an inflatable member positioned along a perimeter of the door frame, thereby applying a uniform pressure to the shielding curtain toward the enclosure frame to form a seal therebetween.

9 Claims, 13 Drawing Sheets

(56) References Cited

U.S. PATENT DOCUMENTS

| | | | |
|---|---|---|---|
| 3,009,984 A | 11/1961 | Lindgren | |
| 3,075,818 A | 1/1963 | Fay | |
| 3,158,016 A | 11/1964 | Fay | |
| 3,189,394 A | 6/1965 | Fay | |
| 3,231,663 A | 1/1966 | Schwartz | |
| 3,297,383 A | 1/1967 | Fay | |
| 3,364,489 A | 1/1968 | Masters | |
| 3,390,491 A | 7/1968 | Howard et al. | |
| 3,492,568 A | 1/1970 | Johnson | |
| 3,518,355 A * | 6/1970 | Luce | H05K 9/0015 174/365 |
| 3,729,740 A | 4/1973 | Nakahara et al. | |
| 3,962,550 A | 6/1976 | Kaiserswerth | |
| D245,303 S | 8/1977 | Gazarek | |
| 4,060,709 A | 11/1977 | Hanson | |
| 4,066,305 A | 1/1978 | Gazarek | |
| D248,003 S | 5/1978 | Gazarek | |
| 4,102,554 A | 7/1978 | Reimer | |
| 4,115,656 A | 9/1978 | Aitel | |
| 4,177,353 A | 12/1979 | McCormack | |
| 4,370,831 A * | 2/1983 | Hamilton | H05K 9/0015 174/375 |
| 4,371,175 A | 2/1983 | Van Dyk, Jr. | |
| 4,399,317 A * | 8/1983 | Van Dyk, Jr. | F16J 15/46 174/356 |
| 4,525,595 A * | 6/1985 | Harriman | H05K 9/0016 174/364 |
| 4,532,513 A | 7/1985 | Halvorson | |
| 4,655,012 A | 4/1987 | Downey et al. | |
| 4,660,014 A | 4/1987 | Wenaas et al. | |
| 4,677,251 A | 6/1987 | Merewether | |
| 4,691,483 A | 9/1987 | Anderson | |
| 4,746,765 A * | 5/1988 | Mallott | H05K 9/0015 174/368 |
| 4,748,790 A | 6/1988 | Frangolacci | |
| 4,750,957 A | 6/1988 | Gustafson | |
| 4,755,630 A | 7/1988 | Smith et al. | |
| H526 H | 9/1988 | Miller | |
| 4,787,181 A | 11/1988 | Witten et al. | |
| D300,097 S | 3/1989 | Cook | |
| 4,884,171 A | 11/1989 | Maserang et al. | |
| 4,894,489 A | 1/1990 | Takahashi et al. | |
| 4,913,476 A | 4/1990 | Cook | |
| H000821 H | 9/1990 | Hatfield et al. | |
| 4,962,358 A | 10/1990 | Svetanoff | |
| 5,045,636 A | 9/1991 | Johnasen et al. | |
| 5,079,388 A | 1/1992 | Balsells | |
| 5,117,066 A | 5/1992 | Balsells | |
| 5,136,119 A | 8/1992 | Leyland | |
| 5,136,453 A | 8/1992 | Oliver | |
| 5,148,111 A | 9/1992 | Shiloh et al. | |
| 5,179,489 A | 1/1993 | Oliver | |
| 5,184,311 A | 2/1993 | Kraus et al. | |
| 5,190,479 A | 3/1993 | Jordi | |
| 5,191,544 A | 3/1993 | Benck et al. | |
| 5,225,631 A * | 7/1993 | Lee | H05K 9/0015 174/358 |
| 5,241,132 A | 8/1993 | McCormack | |
| 5,335,464 A * | 8/1994 | Vanesky | A61B 5/04005 174/374 |
| 5,414,366 A | 5/1995 | Rogers | |
| 5,436,786 A | 7/1995 | Pelly et al. | |
| 5,465,534 A | 11/1995 | Mittag | |
| 5,546,096 A | 8/1996 | Wada | |
| 5,594,200 A | 1/1997 | Ramsey | |
| 5,600,290 A | 2/1997 | Anderson, II | |
| 5,685,358 A | 11/1997 | Kawasaki et al. | |
| 5,749,178 A | 5/1998 | Garmong | |
| 5,751,530 A | 5/1998 | Pelly et al. | |
| 5,828,220 A | 10/1998 | Carney et al. | |
| 5,929,821 A | 7/1999 | Goldstein et al. | |
| 5,939,982 A | 8/1999 | Gagnon et al. | |
| 5,983,578 A | 11/1999 | Huttie et al. | |
| 6,011,504 A | 1/2000 | Tan | |
| 6,068,009 A | 5/2000 | Paes et al. | |
| 6,090,728 A | 7/2000 | Yenni, Jr. et al. | |
| 6,157,546 A | 12/2000 | Petty et al. | |
| 6,185,065 B1 | 2/2001 | Hasegawa et al. | |
| 6,210,787 B1 | 4/2001 | Goto et al. | |
| 6,292,373 B1 | 9/2001 | Li et al. | |
| 6,320,123 B1 | 11/2001 | Reimers | |
| 6,324,075 B1 | 11/2001 | Unrein et al. | |
| 6,346,330 B1 | 2/2002 | Huang et al. | |
| 6,377,473 B1 | 4/2002 | Huang et al. | |
| 6,380,482 B1 | 4/2002 | Norte et al. | |
| 6,426,459 B1 | 7/2002 | Mitchell | |
| 6,442,046 B1 | 8/2002 | Sauer | |
| 6,480,163 B1 | 11/2002 | Knop et al. | |
| 6,485,595 B1 | 11/2002 | Yenni, Jr. et al. | |
| 6,542,380 B1 | 4/2003 | Hailey et al. | |
| 6,542,384 B1 | 4/2003 | Radu et al. | |
| 6,613,979 B1 | 9/2003 | Miller et al. | |
| 6,683,245 B1 | 1/2004 | Ogawa et al. | |
| 6,838,613 B2 | 1/2005 | Kopf | |
| 6,870,092 B2 | 3/2005 | Lambert et al. | |
| 6,872,971 B2 | 3/2005 | Hutchinson et al. | |
| 6,885,846 B1 | 4/2005 | Panasik et al. | |
| 6,891,478 B2 | 5/2005 | Gardner | |
| 7,071,631 B2 | 7/2006 | Howard, II | |
| 7,210,557 B2 | 5/2007 | Phillips et al. | |
| 7,258,574 B2 | 8/2007 | Barringer et al. | |
| 7,369,416 B2 | 5/2008 | Plabst | |
| 7,400,510 B1 | 7/2008 | Milligan et al. | |
| 7,418,802 B2 | 9/2008 | Sarine et al. | |
| 7,420,742 B2 | 9/2008 | Wood et al. | |
| 7,475,624 B1 | 1/2009 | Daily | |
| 7,498,524 B2 | 3/2009 | Brench | |
| 7,504,590 B2 | 3/2009 | Ball | |
| 7,512,430 B2 | 3/2009 | Nakamura | |
| 7,515,219 B2 | 4/2009 | Bozzer et al. | |
| 7,560,135 B2 | 7/2009 | Kotsubo et al. | |
| 7,561,444 B2 | 7/2009 | He | |
| 7,576,289 B2 | 8/2009 | Kessel | |
| 7,589,943 B2 | 9/2009 | Ramirez et al. | |
| 7,710,708 B2 | 5/2010 | Park et al. | |
| 7,839,020 B2 | 11/2010 | Nakanishi | |
| 7,839,136 B1 | 11/2010 | John | |
| 8,085,554 B2 | 12/2011 | Holdredge et al. | |
| 8,183,995 B2 | 5/2012 | Wang et al. | |
| 8,197,473 B2 | 6/2012 | Rossetto et al. | |
| 8,351,221 B2 | 1/2013 | Siomkos et al. | |
| 8,358,512 B2 | 1/2013 | Shiroishi et al. | |
| 8,358,515 B2 | 1/2013 | Chen et al. | |
| 8,373,998 B2 | 2/2013 | Ricci et al. | |
| 8,406,012 B2 | 3/2013 | Kim | |
| 8,493,504 B2 | 7/2013 | Kobayashi et al. | |
| 8,547,710 B2 | 10/2013 | Ruehl et al. | |
| 8,599,576 B2 | 12/2013 | Faxvog et al. | |
| 8,642,900 B2 | 2/2014 | Nordling et al. | |
| 8,643,772 B2 | 2/2014 | Anderson | |
| 8,754,980 B2 | 6/2014 | Anderson et al. | |
| 8,760,859 B2 | 6/2014 | Fuchs et al. | |
| 9,029,714 B2 * | 5/2015 | Winch | H05K 9/0015 174/377 |
| 2001/0046128 A1 | 11/2001 | Ogata | |
| 2002/0060639 A1 | 5/2002 | Harman | |
| 2003/0024172 A1 | 2/2003 | Lyons et al. | |
| 2003/0029101 A1 | 2/2003 | Lyons | |
| 2003/0042990 A1 | 3/2003 | Schumacher | |
| 2003/0174487 A1 | 9/2003 | Garmong | |
| 2004/0112205 A1 | 6/2004 | MacDougall | |
| 2004/0232847 A1 | 11/2004 | Howard, II | |
| 2005/0174749 A1 | 8/2005 | Liikamaa et al. | |
| 2005/0247471 A1 | 11/2005 | Archambeault et al. | |
| 2006/0170430 A1 | 8/2006 | Tarvainen et al. | |
| 2006/0272857 A1 | 12/2006 | Arnold | |
| 2006/0274517 A1 | 12/2006 | Coffy | |
| 2007/0002547 A1 | 1/2007 | Garmong | |
| 2007/0007037 A1 * | 1/2007 | Diaferia | H05K 9/0015 174/382 |
| 2007/0025095 A1 | 2/2007 | Beall et al. | |
| 2007/0084126 A1 * | 4/2007 | Hautmann | E06B 5/18 49/483.1 |

(56) References Cited

U.S. PATENT DOCUMENTS

| | | | |
|---|---|---|---|
| 2007/0093135 A1 | 4/2007 | Luo et al. | |
| 2007/0095568 A1* | 5/2007 | Hautmann | E06B 5/18 174/520 |
| 2007/0105445 A1 | 5/2007 | Manto et al. | |
| 2007/0126871 A1 | 6/2007 | Henninger, III et al. | |
| 2007/0127129 A1 | 6/2007 | Wood et al. | |
| 2007/0158914 A1 | 7/2007 | Tammaro et al. | |
| 2007/0296814 A1 | 12/2007 | Cooper et al. | |
| 2008/0050172 A1 | 2/2008 | Simola et al. | |
| 2008/0080158 A1 | 4/2008 | Crocker et al. | |
| 2008/0250726 A1 | 10/2008 | Slagel et al. | |
| 2009/0067141 A1 | 3/2009 | Dabov et al. | |
| 2009/0125316 A1 | 5/2009 | Moore | |
| 2009/0140499 A1 | 6/2009 | Kline | |
| 2009/0229194 A1 | 9/2009 | Armillas | |
| 2009/0244876 A1 | 10/2009 | Li et al. | |
| 2009/0268420 A1 | 10/2009 | Long | |
| 2009/0278729 A1 | 11/2009 | Bosser et al. | |
| 2009/0291608 A1 | 11/2009 | Choi et al. | |
| 2009/0295587 A1 | 12/2009 | Gorman, Jr. | |
| 2010/0001916 A1 | 1/2010 | Yamaguchi et al. | |
| 2010/0096180 A1 | 4/2010 | Carducci et al. | |
| 2010/0103628 A1 | 4/2010 | Steffler | |
| 2010/0116542 A1 | 5/2010 | Sugihara et al. | |
| 2010/0128455 A1 | 5/2010 | Ophoven et al. | |
| 2010/0208433 A1 | 8/2010 | Heimann et al. | |
| 2010/0315199 A1 | 12/2010 | Slagel et al. | |
| 2010/0315792 A1 | 12/2010 | Jones | |
| 2011/0058035 A1 | 3/2011 | DeBerry et al. | |
| 2011/0088940 A1 | 4/2011 | Nordling et al. | |
| 2011/0092181 A1 | 4/2011 | Jackson et al. | |
| 2011/0169634 A1 | 7/2011 | Raj et al. | |
| 2011/0222249 A1 | 9/2011 | Ruehl et al. | |
| 2011/0267765 A1 | 11/2011 | Fuchs et al. | |
| 2012/0113317 A1 | 5/2012 | Anderson | |
| 2012/0140107 A1 | 6/2012 | Anderson et al. | |
| 2012/0140431 A1 | 6/2012 | Faxvog et al. | |
| 2012/0243846 A1 | 9/2012 | Jackson et al. | |
| 2012/0326729 A1 | 12/2012 | Faxvog et al. | |
| 2013/0152485 A1 | 6/2013 | Austin et al. | |
| 2013/0170159 A1 | 7/2013 | Jiang | |

FOREIGN PATENT DOCUMENTS

| | | |
|---|---|---|
| EP | 1 114 423 B1 | 2/2007 |
| EP | 1860725 | 11/2007 |
| EP | 2 221 921 A1 | 8/2010 |
| GB | 294513 | 7/1928 |
| JP | 11-239288 | 8/1999 |
| JP | 2003-133849 | 5/2003 |

OTHER PUBLICATIONS

Military Handbook 237B, Department of Defense Handbook, Guidance for Controlling Electromagnetic Environmental Effects on Platforms, Systems, and Equipment, 248 Pages, 1997.
Military Handbook 253, Guidance for the Design and Test of Systems Protected Against the Effects of Electromagnetic Energy, 27 Pages, 1978.
Military Handbook 273, Survivability Enhancement, Aircraft, Nuclear Weapon Threat, Design and Evaluation Guidelines, 228 Pages, 1983.
Military Handbook 411B, Power and the Environment for Sensitive DoD Electronic Equipment (General), vol. 1, 658 pages, 1990.
Military Handbook 419A, Grounding, Bonding, and Shielding for Electronic Equipments and Facilities, vol. 1 of 2 Volumes, Basic Theory, 812 Pages, 1987.
Military Handbook 1857, Grounding, Bonding and Shielding Design Practices, 185 Pages, 1998.
Military Handbook 5961A, List of Standard Semiconductor Devices, 33 pages, 1999.
Military Standard 188-124B, Grounding, Bonding and Shielding, for Common Long Haul/Tactical Communication Systems Including Ground Based Communications-Electronics Facilities and Equipments, 41 Pages, 1992.
Military Standard 188-125-1, Department of Defense Interface Standard, High-Altitude Electromagnetic Pulse (HEMP) Protection for Ground-Based C41 Facilities Performing Critical, Time-Urgent Missions (Part 1—Fixed Facilities), 107 Pages, 1998.
Military Standard 188-125-2, Department of Defense Interface Standard, High-Altitude Electromagnetic Pulse (HEMP) Protection for Ground-Based C41 Facilities Performing Critical, Time-Urgent Missions (Part 2—Transportable Systems), 148 Pages, 1999.
Military Standard 188-125, High-Altitude Electromagnetic Pulse (HEMP) Protection for Ground-Based C41 Facilities Performing Critical, Time-Urgent Missions (vol. 1—Fixed Facilities), 114 Pages, Feb. 1994.
Military Standard 220C, Department of Defense—Test Method Standard—Method of Insertion Loss Measurement, 19 Pages, 2009.
Military Standard 285—Notice of Cancellation—MIL-STD-285, dated 1956 canceled, 17 Pages, 1997.
Military Standard 285, Military Standard Attenuation Measurements for Enclosures, Electromagnetic Shielding, for Electronic Test Purposes, 15 Pages, 1956.
Military Standard 461C, Electromagnetic Emission and Susceptibility Requirements for the Control of Electromagnetic Interference, 183 Pages, 1986.
Military Standard 461E, Requirements for the Control of Electromagnetic Interference Characteristics of Subsystems and Equipment, 253 Pages, 1999.
Military Standard 461F, Requirements for the Control of Electromagnetic Interference Characteristics of Subsystems and Equipment, 269 Pages, 2007.
Military Standard 462, Electromagnetic Interference Characteristics, 80 Pages, 1967.
Military Standard 462D, Measurement of Electromagnetic Interference Characteristics, 203 Pages, 1993.
Military Standard 464, Electromagnetic Environmental Effects Requirements for Systems, 116 pages, 1997.
Military Standard 464A, Electromagnetic Environmental Effects Requirements for Systems, 121 pages, 2002.
Military Standard 469B, Radar Engineering Interface Requirements, Electromagnetic Compatibility, 98 Pages, 1996.
Military Standard 1542B (USAF), Electromagnetic Compatibility and Grounding Requirements for Space System Facilities, 52 Pages, 1991.
Military Handbook 1195, Radio Frequency Shielded Enclosures, 86 Pages, Sep. 1988.
IEEE Std 299-1997, IEEE Standard Method for Measuring the Effectiveness of Electromagnetic Shielding Enclosures, 44 Pages, 1997.
Leland H. Hemming, Architectural Electromagnetic Shielding Handbook—A Design Specification Guide, IEEE Press, 232 Pages, 1991.
USAF Handbook for the Design and Construction of HEMP/TEMPEST Shielded Facilities, AF Regional Civil Engineer Central Region, Dallas, Texas, 39 Pages, 1986.
ETS-LINDGREN—High Performance EMI/RFI Shielding Solutions, 2 Pages, 2002.
ETS-LINDGREN—Double Electrically Isolated RF Enclosures, For Industrial, Communication, and Research and Development Applications, 8 Pages, 2005.
ETS-LINDGREN—Tempest Information Processing System (TIPS), 2 Pages, 2008.
ETS-LINDGREN—Table Top Enclosure—5240 Series, 2 Pages, 2009.
ETS-LINDGREN—Auto Latching Door System, 2 Pages, (undated).
ETS-LINDGREN—RF Shielded Doors, 5 Pages, (undated).
NSA-94-106, National Security Agency Specification for Shielded Enclosures, 9 Pages, 1994.
Holland Shielding Systems BV, Shielding Gaskets With or Without Water Seal (EMI-RFI-IP Gaskets), 2 Pages, (undated).

(56) References Cited

OTHER PUBLICATIONS

Holland Shielding Systems BV, EMI-RFI-EMP—Shielded Doors for Faraday Cages and EMI-RFI Shielded Room, 5 Pages, (undated).
Holland Shielding Systems BV, Innovative EMI Shielding Solutions—Gasket Selection, 36 Pages, (undated).
Equipto Electronic Corporation—Technical Guide to EMI/RFI Suppression in Electronic Cabinets, 16 Pages, Apr. 2005.
Crenlo-Emcor-Product-Options-Doors, 12 Pages, (undated).
RFI/EMI Shielded Cabinets and Features Available, 4 Pages, (undated).
Special Door Company, Radiation Shielding Doors: SH Door Tech, 2 Pages, (undated).
Special Door Company, EMP Doors: Electro Magnetic Pulse Doors, 3 Pages, (undated).
Braden Shielding Systems, Anechoic Chambers, EMC Chambers, MRI Enclosures, 1 Page, (undated).
Magnetic Shield Corp.—Bensenville, Illinois, Magnetic Shielding, 2 Pages, (undated).
EEP—Electromagnetic Radiation Shielding & Magnetic Field Shielding Technology—Products and Services, 3 Pages, (undated).
Fleming—RF & EMI Shielded Doors, Radiation Shielded Doors, 3 Pages, (undated).
H. Bloks, "NEMP/EMI Shielding," EMC Technology, vol. 5, No. 6, Nov.-Dec. 1986, 5 Pages.
W.E. Curran, "New Techniques in Shielding," ITEM, 1984, 9 Pages.
W. E. Curran, "Shielding for HEMP/TEMPEST Requirements," ITEM, 1988, 10 Pages.
IEEE Transaction on Advanced Packaging, "Electromagnetic Interference (EMI) of System-on-Package (SOP)," vol. 27, No. 2, pp. 304-314, May 2004.
International Search Report and Written Opinion for Application No. PCT/US2014/026760 mailed Feb. 2, 2015.
Partial International Search Report for Application No. PCT/US2014/026760 mailed Dec. 10, 2014.

* cited by examiner

ELECTROMAGNETICALLY PROTECTED ELECTRONIC ENCLOSURE

CROSS-REFERENCE TO RELATED APPLICATIONS

The present application claims priority from U.S. Provisional Application No. 61/784,891, filed on Mar. 14, 2013, the disclosure of which is hereby incorporated by reference in its entirety.

TECHNICAL FIELD

The present disclosure relates generally to electronic equipment or devices. In particular, the present disclosure relates to electromagnetic protection of electronic equipment, such as power utility electronic equipment, supervisory control & data acquisition (SCADA) systems, communications systems, data processing systems or other semiconductor-based electronic systems.

BACKGROUND

Electronic equipment, including equipment based on semiconductor technology, is susceptible to damage or binary state upsets from High Altitude Electromagnetic Pulse (HEMP or EMP), Intentional Electromagnetic Interference (IEMI) and RF interference. For example, stored data in modern electronic data systems, control systems and recording systems can be upset, scrambled or lost by EMP, IEMI or RF energy. At higher energy levels of EMP, IEMI or RF power the semiconductor devices within electronics units can be destroyed.

Damage based on exposure to electromagnetic fields is not limited to semiconductor-based electronic systems. For example, EMP and IEMI events can cause interference or upset and or damage to electrical equipment, causing that equipment to malfunction or rendering it nonoperational. Electrical equipment can also be destroyed by strong electromagnetic pulse (EMP), intentional electromagnetic interference (IEMI) or high power RF radiation. The detailed characteristics of EMP radiation are described in Military Standard 188-125, entitled "High Altitude Electromagnetic Pulse Protection for Ground Based C4I Facilities Performing Critical, Time-Urgent Missions". The detailed characteristics of IEMI are described in IEC Standard 61000-2-13, "High-power electromagnetic (HPEM) environments-Radiated and conducted."

In general, EMP/IEMI/RF events typically take one of two forms. First, high-field events correspond to short-duration, high electromagnetic field events (e.g., up to and exceeding 100 kilovolts per meter), and typically are of the form of short pulses of narrow-band or distributed signals (e.g., in the frequency range of typically 14 kHz to 10 GHz). These types of events typically generate high voltage differences in equipment, leading to high induced currents and burnout of electrical components. Second, low-field events (e.g., events in the range of 0.01 to 10 volts per meter) are indications of changing electromagnetic environments below the high field damaging environments, but still of interest in certain applications. Low field events can also cause upsets in the binary states of digital electronic equipment yielding non-functioning electrical or computing equipment.

Existing electromagnetic protection schemes are typically used to protect against a narrow range of threats. The protection schemes built into electronic systems or cabinets are generally developed to address a certain possible issue, and are not useful to address other electromagnetic interference issues. Although attempts have been made to "harden" or protect, certain military systems against these threats, many commercial electronic systems or cabinets remain unprotected. However, these existing "hardening" solutions are cost-prohibitive to apply to a wide range of electronics, exposing critical assets to possible damage. Additionally, existing solutions provide some amount of shielding, but are not designed to accommodate all of the cooling and access considerations required of many modern electronic system or cabinets. Additionally, earlier shielding attempts could at times limit the functionality of electronics included in such systems, since at times power or other signals would be entirely disrupted to avoid damage or upsets to internal electronics. Still further, many attempts to create shielding enclosures fail because of the strict manufacturing tolerances required to ensure that the enclosures can maintain a seal from outside sources of EMP/IEMI/RF signals. Because the vast majority of electronics remain unprotected from EMP/IEMI/RF events, a widespread outage or failure due to electromagnetic interference could have disastrous effects.

For these and other reasons, improvements are desirable.

SUMMARY

In accordance with the following disclosure, the above and other issues are addressed by the following:

In a first aspect, a shielding arrangement for electronic equipment is disclosed. The shielding arrangement includes a shielding enclosure having an interior volume, the interior volume defining a protected portion, the shielding enclosure further having one open side. The shielding arrangement further includes an enclosure frame welded to the open side of the shielding enclosure, and a door assembly having an opened and closed position, the door assembly providing access to at least the protected portion of the shielding enclosure and being secured to the enclosure. The door assembly includes a metal frame, a metal outer wall, a shielding curtain moveably attached to the metal frame, and an inflatable member positioned along a perimeter of the metal frame and between the metal frame and the shielding curtain. The inflatable member is selected and positioned to, when inflated, apply a uniform pressure to the shielding curtain toward the enclosure frame to form a seal when the door assembly is in the closed position.

In a second aspect, a method of shielding electronic equipment within an enclosure includes positioning electronic equipment within an interior volume of a shielding enclosure having an opening providing access to the interior volume, the opening surrounded by an enclosure frame. The method further includes closing a door to the shielding enclosure, thereby closing off the opening, and engaging one or more latches to affix the door in a closed position, the door including a shielding curtain positioned across the opening. The method also includes inflating an inflatable member positioned along a perimeter of the door frame, the thereby applying a uniform pressure to the shielding curtain toward the enclosure frame to form a seal therebetween.

In a third aspect, a door assembly for shielding electronic equipment includes a metal frame, a metal outer wall, a shielding curtain moveably attached to the metal frame, and a hollow, inflatable member positioned along a perimeter of the metal frame and between the metal frame and the shielding curtain.

In a fourth aspect, a latch for a door assembly includes a first mounting plate having a first plurality of hollow cylinders, positioned along an edge of the first mounting plate, wherein the first plurality of hollow cylinders each includes a gap in at least a portion of the hollow cylinders. The latch further includes a second mounting plate having a second plurality of hollow cylinders positioned along an edge of the second mounting plate, the second plurality of hollow cylinders offset from the first plurality of hollow cylinders such that, when the first and second mounting plate are aligned, the first and second plurality of hollow cylinders form a column of alternating hollow cylinders from the first and second pluralities of hollow cylinders. The latch further includes a latch hinge including a plurality of pins extending from a locking flange and movable between engaged and disengaged positions by sliding the latch hinge in a direction parallel with an axis through the column of alternating hollow cylinders. In the engaged position, the plurality of pins of the latch hinge are at least partially positioned within hollow cylinders of the first and second pluralities of hollow cylinders and a portion of the latch hinge connecting the plurality of pins to the locking flange extends through the gap in each of the first hollow cylinders. In the disengaged position, the plurality of pins of the latch hinge are positioned within the first plurality of hollow cylinders.

DETAILED DESCRIPTION

Figure 1:
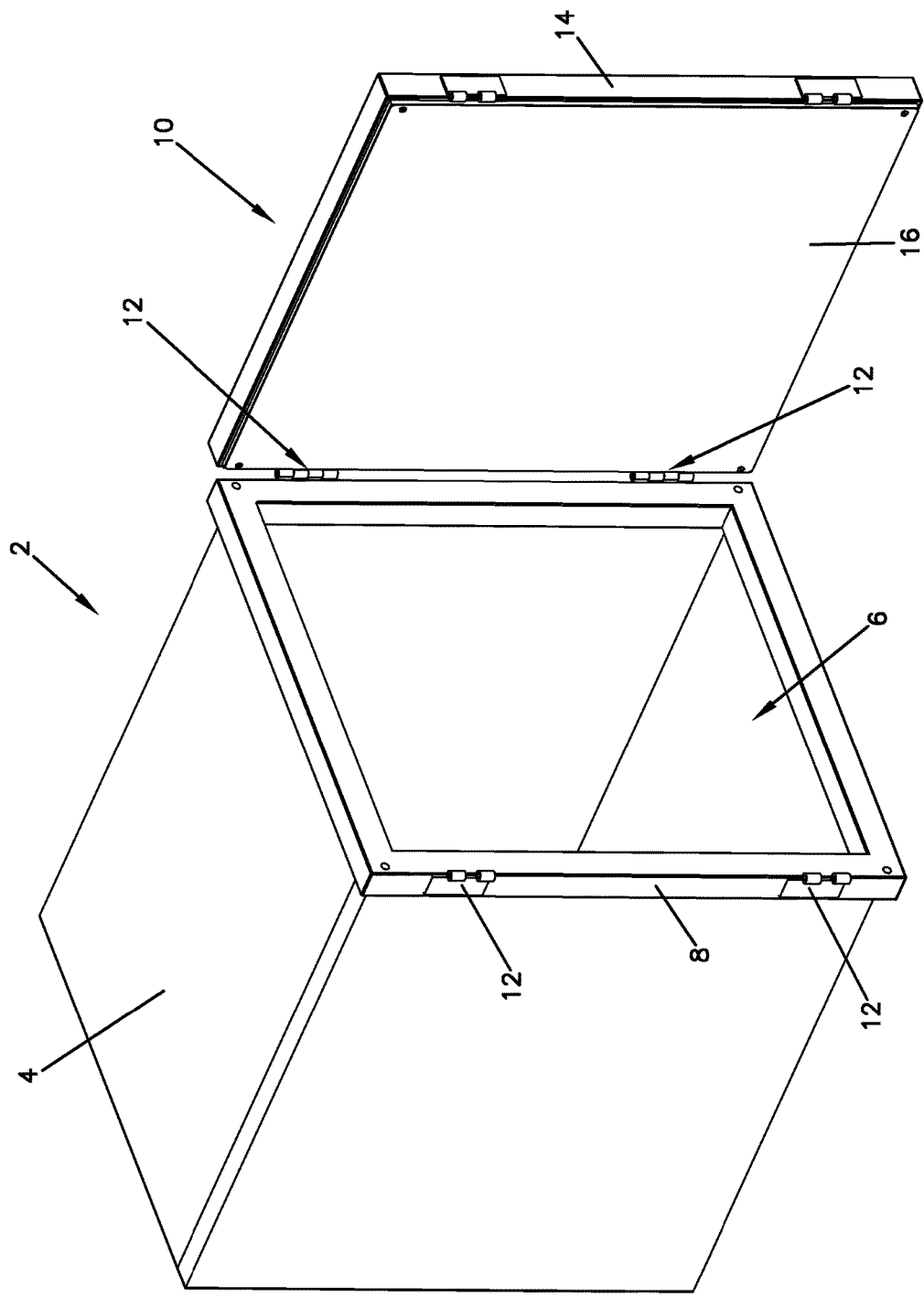
FIG. 1 shows a shielding cabinet arrangement including an EMP/IEMI/RF protected enclosure providing protection against both radiated and conducted electromagnetic energy.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general the present disclosure describes, generally, shielded enclosures, such as electronic cabinets, that are capable of providing shielding from various types of electromagnetic events capable of upsetting and or damaging electronic equipment. In some of the various embodiments described herein, the shielded enclosures can be, for example, constructed of steel or aluminum that is sealed with welded seams and an inflatable member for sealing a metal cover, front panel or other closure surface. The shielded enclosures provide attenuation of radiated electromagnetic energy, such that harmful signals essentially cannot penetrate the enclosure. The shielded enclosures disclosed herein can also, in some embodiments, include electrical filters that provide a path for signals to enter and exit the enclosure, but greatly attenuate the unwanted electromagnetic conducted energy, which typically occurs at higher frequencies. Additionally, in some embodiments the shielded enclosures includes honeycomb waveguide air vents that also provide attenuation of radiated electromagnetic waves/energy, which also reduce unwanted EMP, IEMI and RF energy entering the enclosure, and reduce the risk of damage or upsets to electronic equipment within such electronic cabinets in a cost-effective and compact structure, while concurrently meeting management access and airflow management requirements of electronics systems.

In some embodiments, the present disclosure relates to a low cost and practical method to protect electronic equipment, including SCADA systems, Electrical utility breaker equipment, and communications systems from EMP, IEMI and RF weapons. Using the systems and methods of the present disclosure, SCADA, electrical utility breaker and communications electronics can be better protected from being destroyed or disabled by EMP, IEMI or RF weapons than unprotected equipment. According to various embodiments, the electronics are placed in an EMP/IEMI/RF shielded enclosure, and electrical or other communicative interfaces are sealed and filtered to prevent entry into that enclosure of unwanted signals to interfere with the electronic equipment. Signal filters (housed within one or more containers) are configured to filter out and remove all high frequency, for example greater than typically 14 kHz for EMP and greater than 1 MHz for IEMI, electromagnetic energy. In a first example embodiment shown in FIG. 1, an enclosure 2 for an electronic device(s) is shown, which provides shielding from potentially damaging EMP/IEMI/RF signals. In the embodiment shown, the enclosure 2 includes a shielded enclosure 4. The shielded enclosure 4 has an interior volume formed from a protected region 6. In certain embodiments the shielded enclosure 4 has dimensions comprising of a length (e.g., about 2 to 5 feet), width (e.g., about 2 to 3 feet) and height (e.g., about 2 to 7 feet). The shielded enclosure 4 generally provides attenuation of potentially harmful electromagnetic signals for at least components placed within the protected region 6. In various embodiments, the shielded enclosure 4 can be constructed from conductive materials, such as a metal (e.g., sheet metal or aluminum) having a thickness generally sufficient to attenuate electromagnetic signals to acceptable levels. In an example embodiment, the shielded enclosure 4 provides 80 dB or more of attenuation.

Generally, the shielded enclosure 4 can contain electronics that include digital or analog electronics; however, other types of electronics systems, including mixed digital/analog electronics could be used as well. In some example embodiments, the electronics can include digital or analog electronics, fiber to electrical signal converters, and power supplies. The electronics are shielded from the potentially harmful electromagnetic signals, and therefore are placed within the protected region 6. In the context of the present disclosure, the electromagnetic signals that are intended to be shielded are high energy signals, typically having magnitudes and frequencies in typical communication ranges experienced by electronic systems. For example, the short duration, high energy signals provided by EMP/IEMI/RF events are shielded. In some embodiments it is recognized that electronics maintained within the protected region 6 will generally require power and/or communicative connections. Accordingly, in some embodiments, a plurality of filters are positioned at least partially within the protected region 6, and configured to filter out signals outside of an expected frequency or magnitude range. Also in some embodiments, filters can provide filtration of electrical or communicative signals, and filters can provide filtration and "cleaning" of a power signal. In various embodiments, the filters could be, for example, band-pass, low-pass, or common mode filters, or even a surge arrester. Other types of filters could be included as well. In certain embodiments, the signal output by the power filter is passed to a power supply, which regulates the received, filtered power signal (e.g., a DC or AC signal) and provides a power signal (e.g., a direct current signal at a predetermined voltage desired by the electronics).

In certain embodiments, the enclosure 4 can also contain fiber-optic equipment; accordingly, a waveguide beyond cutoff can be included, and a fiber-optic cable can be extended from external to the enclosure, through an unprotected region, and into the protected region 6 (e.g., to a fiber converter). The waveguide beyond cutoff can be configured to allow optical signals of a predetermined frequency to pass from the unprotected portion to the protected portion, while filtering undesirable signals of different frequency or magnitude.

Furthermore, it is recognized that in many circumstances, the electronics included within an enclosure 4 may require airflow, for example for cooling purposes. In certain embodiments, the enclosure 4 includes a plurality of vents (not shown) through the enclosure 4 which allow airflow from external to the enclosure to pass into the protected region 6. In certain embodiments, the vents can be positioned in alignment to allow a flow-through, aligned configuration. In alternative embodiments, different positions of vents could be used. Each of the vents can include a waveguide beyond cutoff having one or more honeycomb-shaped or otherwise stacked shapes and arranged apertures configured to shield the interior volume of the enclosure 2, including the protected region 6, from exposure to electromagnetic signals exceeding a predetermined acceptable magnitude and frequency. For example, signals up to 10 GHz and up to exceeding about 14 kHz, or about 100 kilovolts per meter, can be filtered by correctly selected sizes of waveguide apertures. Example vents, as well as additional features relating to electromagnetically-shielding enclosures and methods for sealing such enclosures, are provided in co-pending U.S. patent application Ser. No. 13/285,581, filed on Oct. 31, 2011, the disclosure of which is hereby incorporated by reference in its entirety.

In the preferred embodiment, the shielded enclosure 4 has an enclosure frame 8 welded around the perimeter of the shielded enclosure 4. The enclosure frame 8 is secured to shielded enclosure 4 with a high quality weld such that cracks and pin holes are avoided so that IEMI and EMP energy is prevented from entering the enclosure 4. In certain embodiments, the enclosure frame 8 can be made from steel, having a nickel or nickel-based coating. The enclosure frame 8 can also be constructed to have a planar and smooth front surface, for example by applying a surface grind operation thereto. The enclosure frame 8 having a shielded door assembly 10 secured to a side of the enclosure frame 8 by a plurality of latch hinges 12. The shielded door 10 provides a high attenuation of electro-magnetic energy, IEMI and EMP, when the door is in its closed position energy will not enter the protected region 6.

In certain embodiments the door assembly 10 is comprised of a tubular door frame 14 having a shielding curtain 16 attached to the interior side of the door frame 14, closest to the protectable region 6. In some embodiments, the interior side of the door frame 14 can also be constructed to have a planar and smooth surface finish, for example by applying a surface grind operation thereto. In certain embodiments, the shielding curtain 16 can be made of steel and be nickel coated. Also, in some embodiments, the shielding curtain may also be constructed to have a planar and smooth surface finish, for example by applying a surface grind operation thereto. When the door is closed, the curtain 16 mates with the nickel coated enclosure frame 8, such that the mating surfaces will provide a high attenuation seal to prevent IEMI and EMP energy from entering the protected region 6. Details regarding this mating arrangement are provided in further detail below.

Figure 2:
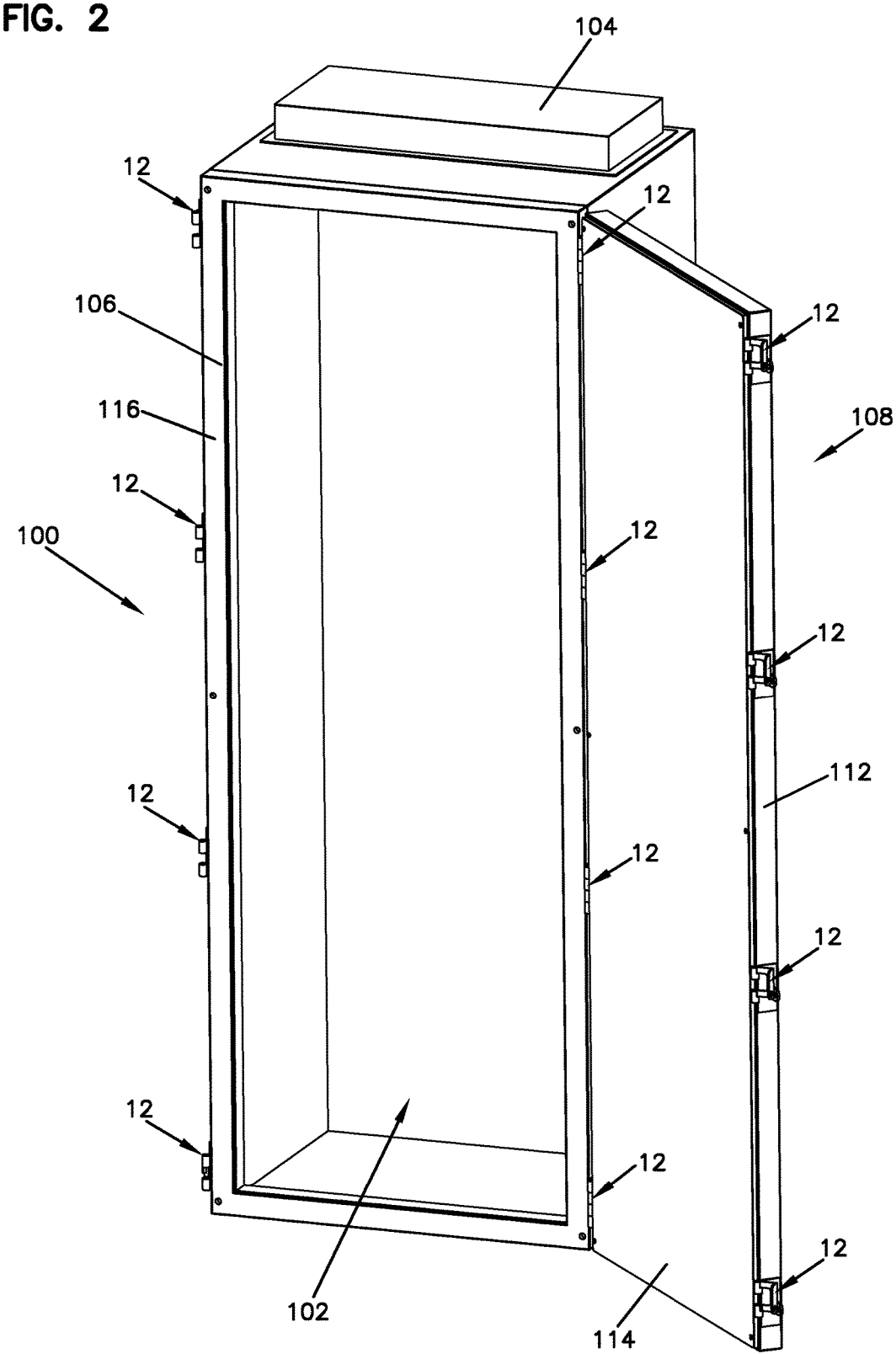
FIG. 2 shows an alternative rectangular enclosure embodiment.

In a second possible embodiment, such as is shown in FIG. 2, below, an electrically conductive or RF material can be used around the perimeter of the enclosure frame 8 to provide a gasket seal between the enclosure frame 8 and the door curtain 16. This gasket material around the perimeter of the enclosure frame 8 could be several millimeters in thickness and have a width of one to three inches. This gasket material could be glued in place onto the enclosure frame 8. An additional metal frame could be placed around either the outer or inner perimeter of the gasket material to provide a physical stop such that the gasket material would be accurately compressed to within a specified tolerance to achieve high electromagnetic (RF/IEMI/EMP) attenuation.

FIG. 2 shows an alternative rectangular shaped shielded enclosure 100, according to a second possible embodiment. The shielded enclosure 100 has an interior volume formed from a protected region 102 and an unprotected region 106. In comparison to enclosure 2 of FIG. 1, enclosure 100 is designed to be a generally larger enclosure, having dimensions at an upper end of the above-described range.

The shielded enclosure 100 has an interior volume formed from a protected region 102 and an unprotected region 104. The unprotected enclosure 104 can be sealed with an electrically conductive or RF gasket around the perimeter of the unprotected enclosure 104. The unprotected portion 104 can house the various signal or Ethernet signal filters for signal inputs and outputs from the enclosure, as necessary based on the type of electronics included in the overall arrangement 100. In certain embodiments, the enclosure 100 can also contain fiber-optic equipment; accordingly, a waveguide beyond cutoff can be included, and a fiber-optic cable can be extended from external to the enclosure, through the unprotected region 104, and into the protected region 102 (e.g., to a fiber converter). Additionally, vents, such as those discussed above, could be included as well.

In the embodiment shown, the shielded enclosure 100 has an enclosure frame 106 welded around the perimeter of the shielded enclosure 100. The enclosure frame 106 being secured to shielded enclosure 100 with a high quality weld such that cracks and pin holes are avoided so that RF, IEMI and EMP energy is prevented from entering the enclosure 100. As noted above, enclosure frame 106 can also be constructed to have a planar and smooth front surface, for example by applying a surface grind operation thereto. In certain embodiments, the enclosure frame 106 can be made from steel and have a nickel coating.

The enclosure frame 106 has a shielded door assembly 108 secured to a side of the enclosure frame by a plurality of latch hinges 12. The shielded door assembly 108 provides a high attenuation of electro-magnetic energy, RF, IEMI and EMP, such that when the door is in its closed position energy will not enter the protected region 102. In certain embodiments the door assembly 108 is comprised of a tubular frame 112 having a shielding curtain 114 attached to the interior side closest to the protectable region 102. In certain embodiments, the shielding curtain 114 can be made of steel and be Nickel coated such that when it mates with the nickel coated enclosure frame 106 the mating surfaces will provide a high attenuation seal to prevent IEMI and EMP energy from entering the protected region 102.

In some embodiments, an electrically conductive or RF gasket material 116 can be used around the perimeter of the enclosure frame 106 to provide a gasket seal between the enclosure frame 106 and the shielding curtain 114. This gasket material 116 around the perimeter of the enclosure frame 106 could be several millimeters in thickness and have a width of one to three inches. The gasket material 116 could be glued or otherwise affixed in place, onto the enclosure frame 106. An additional metal frame (not shown) could be placed around either the outer or inner perimeter of the gasket material 116 to provide a physical stop such that the gasket material 116 would be accurately compressed to within a specified tolerance to achieve high electromagnetic (RF/IEMI/EMP) attenuation when the door of the enclosure is in a closed position.

Figure 3:
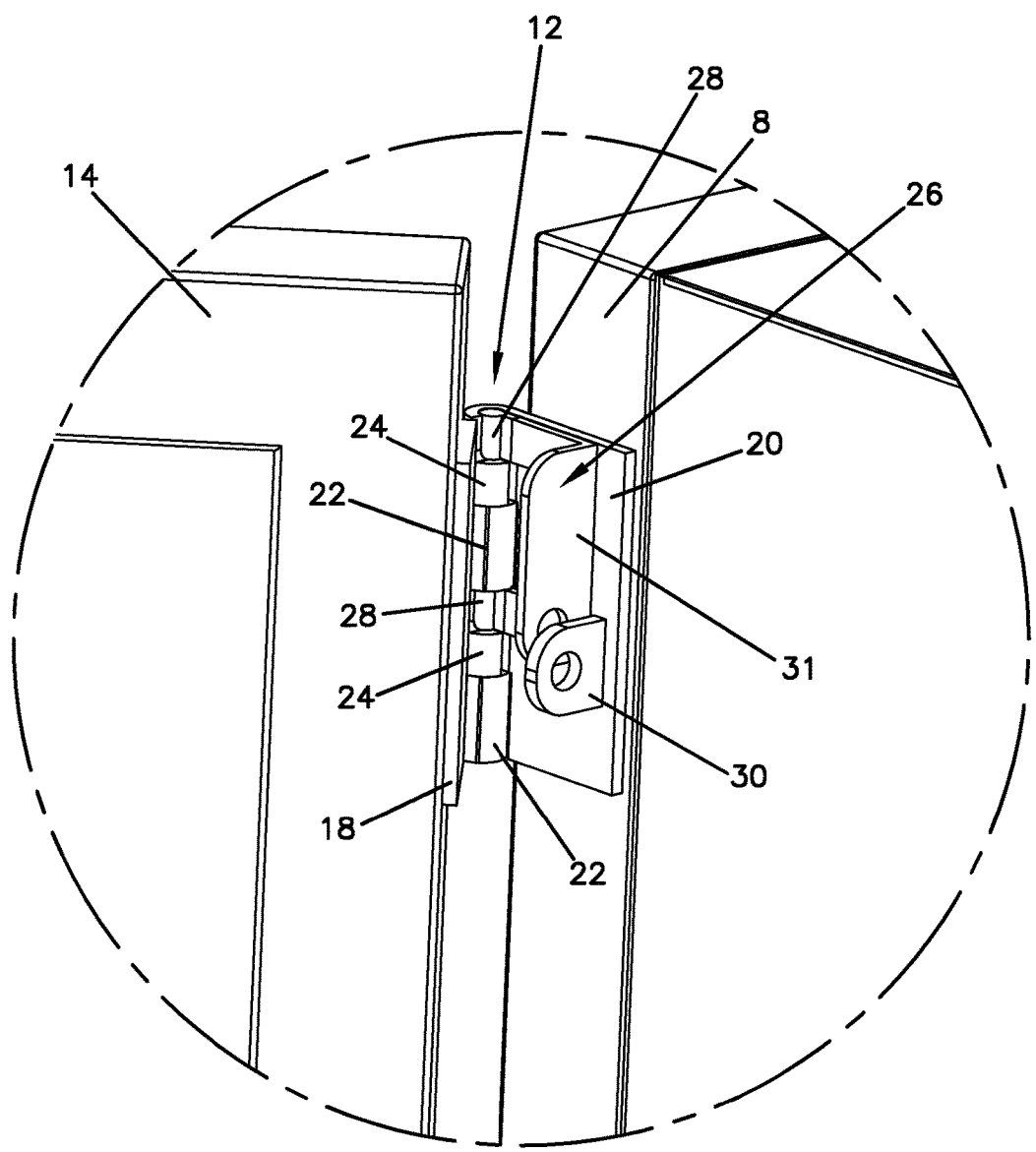
FIG. 3 shows a latching hinge to connect the enclosure door and enclosure body shown in FIG. 1.

FIG. 3 shows a detailed view of the latch hinge 12 shown in FIGS. 1 and 2. In certain embodiments the latch hinges 12 may be located on the sides of the enclosure frame 8, on the top and bottom of the enclosure frame 8, or both. The latch hinge 12 includes two mounting plates 18, 20: a first mounting plate 18 is mounted to the metal tubular door frame 14 and the second mounting plate 20 is mounted to the enclosure frame 8. In certain embodiments, the mounting plate 20 secured on the enclosure frame 8 includes a plurality of vertical hollow cylinders 22, typically steel or other durable material, spaced along the edge closest to the door opening. The mounting plate 18 can also include a plurality of vertical hollow cylinders 24 located closest to the enclosure opening. The vertical hollow cylinders 24 on the door mounting plate 18 are complementary to the vertical hollow cylinders 22 on the enclosure frame mounting plate 20 such that when the door is in the closed position the vertical hollow cylinders 22, 24 align in a vertical stack of alternating hollow cylinders. Such an arrangement allows for a pin to be placed between the hollow cylinders 22, 24 so that door frame 14 and enclosure frame 8 can rotate relative one another via a fixed axis of rotation.

Figure 10A:
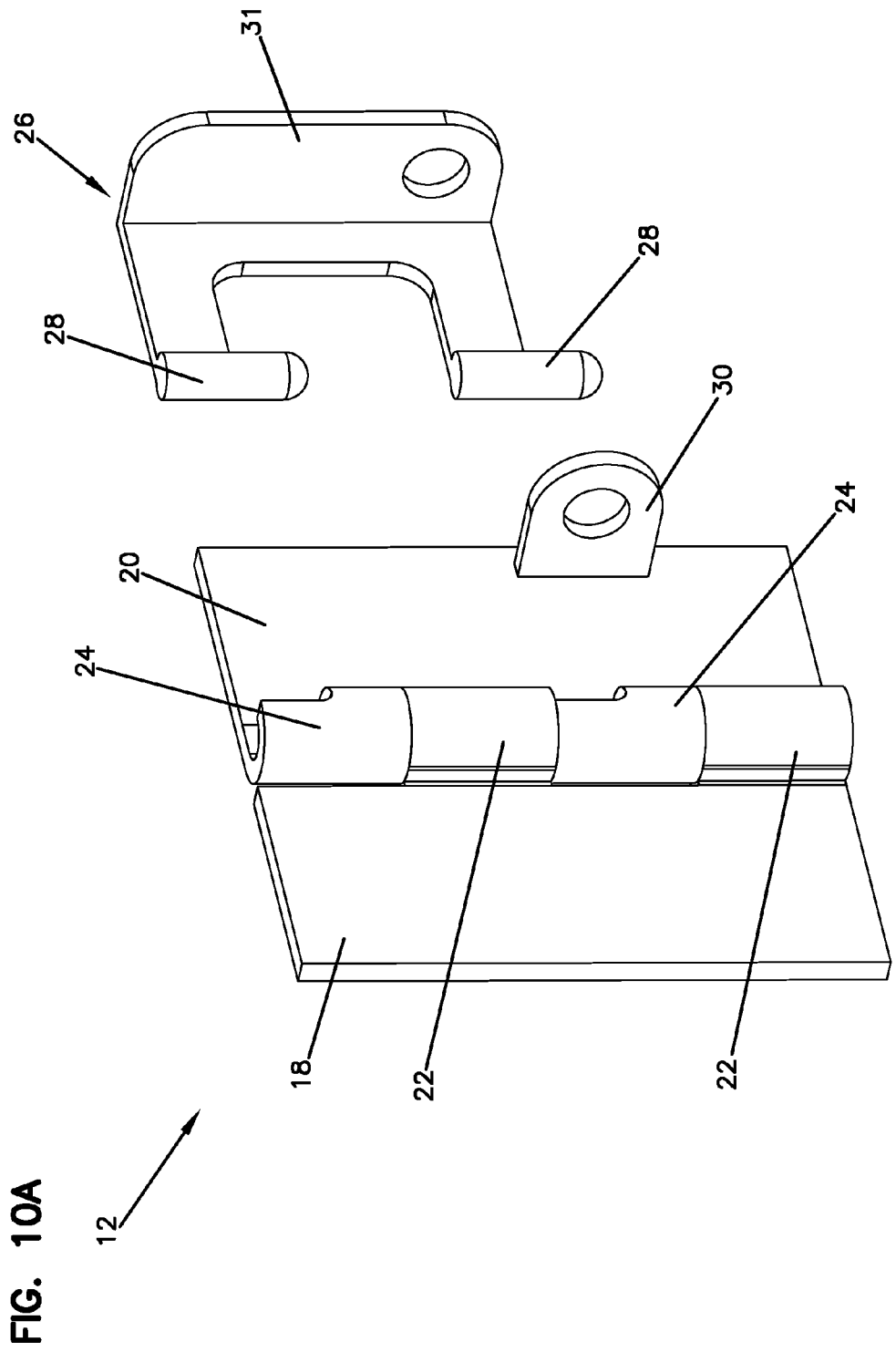
FIG. 10A shows a view of a hinge assembly useable to attach a door to an enclosure according to example aspects of the present disclosure.
Figure 10B:
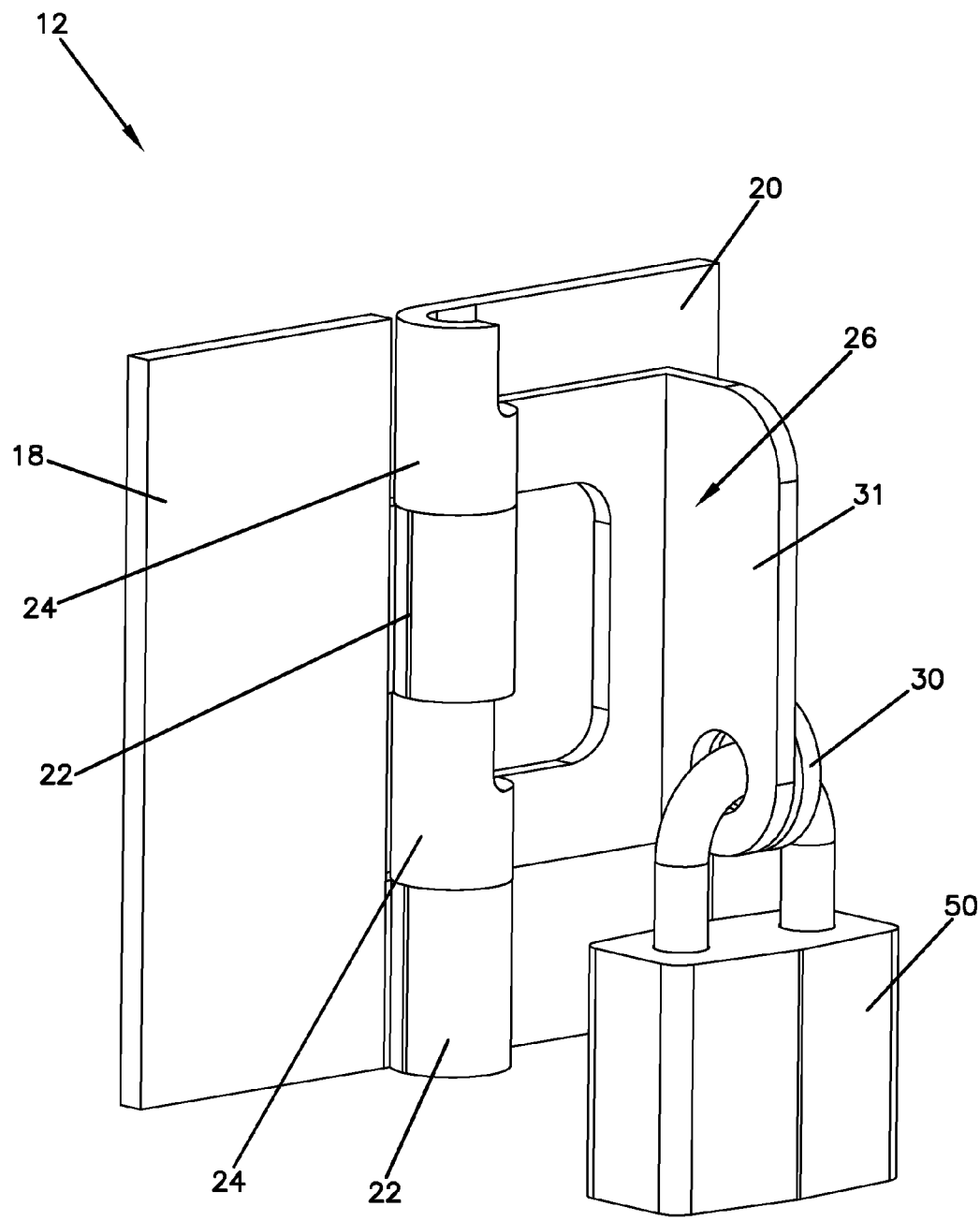
FIG. 10B shows the hinge assembly of FIG. 10A in a locked position.
Figure 10C:
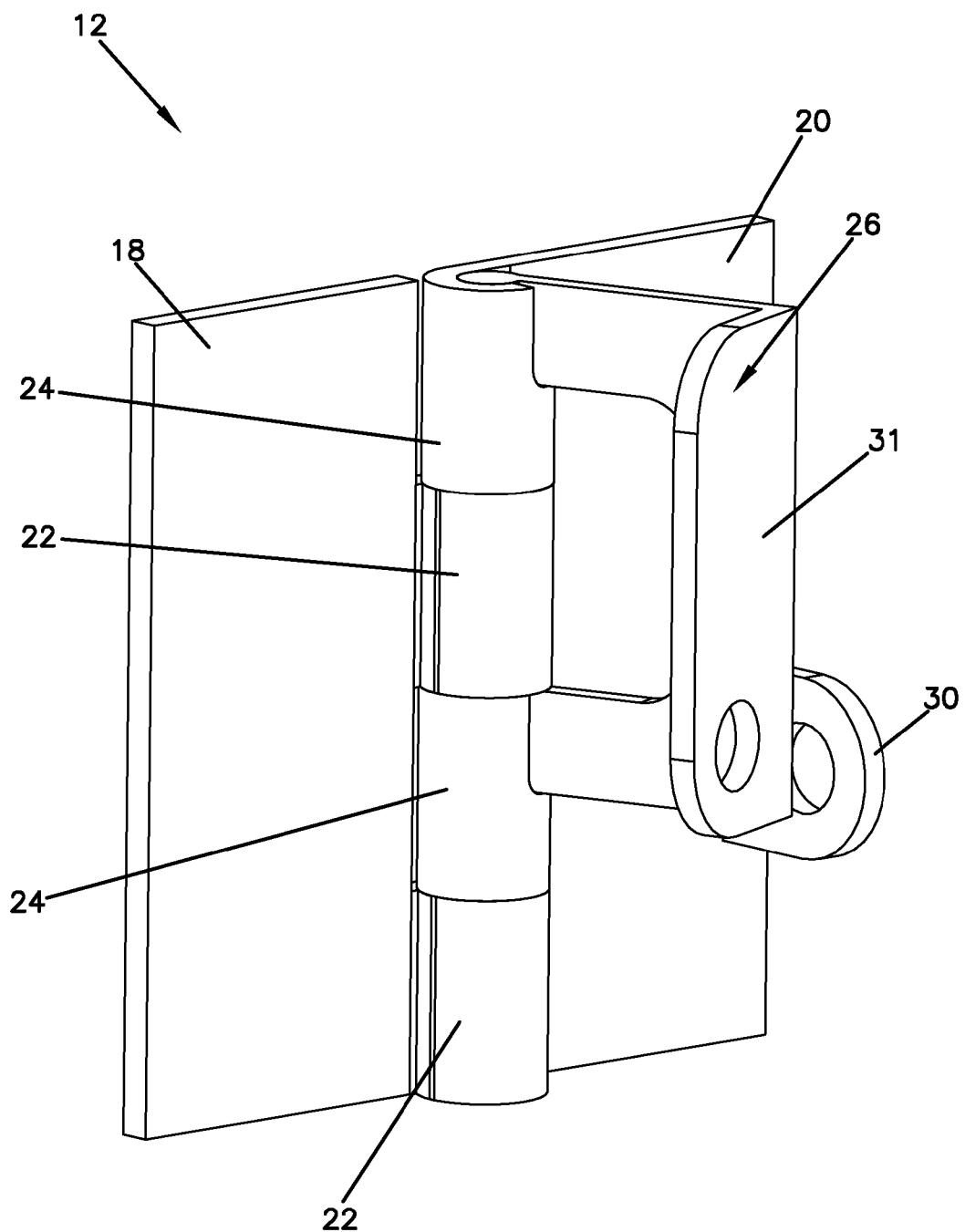
FIG. 10C shows the hinge assembly of FIG. 10A in an unlocked position.
Figure 10D:
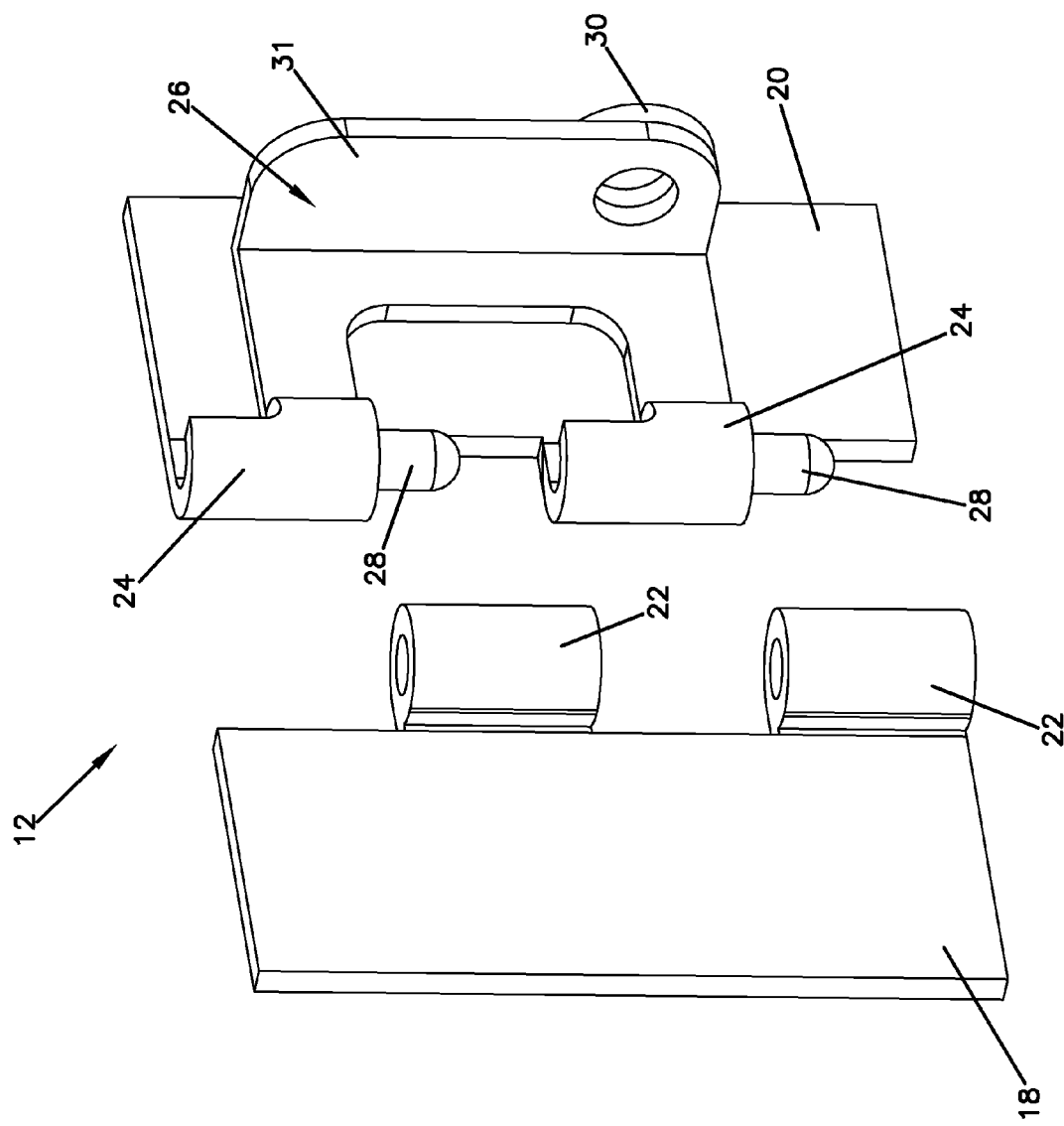
FIG. 10D shows the hinge assembly of FIG. 10A in a detachable arrangement used as a latch.

In some embodiments and as best shown in FIG. 10A, the door frame mounting plate 18 or the enclosure frame mounting plate 20 can include a latch 26. The latch 26 includes a plurality of pins 28 positioned to align with the vertical stack hollow cylinders 22, 24. In the embodiment shown, the latch 26 has three positions: open, closed and locked. In the open position, the pins 28 on the latch 26 are in a retracted position generally removed from the vertical hollow cylinders 22, 24 (as seen in FIG. 10D). To move to the closed position, the latch 26 is rotated in an outward direction (e.g., toward one of the mounting plates 18, 20). When rotating the latch 26 to a predetermined position, the pins 28 slide vertically downward in the vertical hollow cylinders 22, 24 of the mounting plates 18, 20 (as seen in FIG. 10B). This is due to the portion of the latch 26 extending from the pins aligning with an open portion, or gap, in the hollow cylinders 22, 24. Once the door frame 14 is in a closed position, and the mounting plates 18, 20 are mated together and the latch pins 28 slides into the gap in vertical hollow cylinders 22, 24. In this "engaged" position the pins 28 reside at least partially within both hollow cylinders 22, 24. By way of contrast, in the open position, the pins 28 will reside only within one of the pluralities of hollow cylinders (e.g., hollow cylinders 22).

To achieve the locked position, both the latch 26 and the mated mounting plate are adapted to have a locking flanges 30, 31 to accept an external lock (e.g. lock 50) so that the bolt on the external lock passes through both locking flanges 30, 31. In the locked position, the mounting plates 18, 20 are pivotably connected such that the mounting plates and latch 26 operate as a hinge. To open the door assembly 10, a user will disengage at least one such latch hinge 12 on one side of the frame, allowing a latch hinge on an opposite side to act as a hinge and pivot the door open (or, alternatively, to disengage all latch hinges 12, thereby removing the shielded door assembly 108 from the enclosure frame 106 altogether to access the protected region 102. To accomplish disengagement of a latch hinge 12, the latch 26 is lifted and rotated away from the enclosure 4, as shown in FIG. 10C, 10D). This will disengage the pins 28. Such an arrangement allows for the user of the enclosure 4 to open the door assembly 10 from either side of the enclosure 4, and in certain embodiments the door 10 may be opened upwards or downwards when latch hinges 12 are located on the top and bottom of the enclosure 4. In still further embodiments, the latch hinges 12 can all be disengaged and the shielded door assembly 108 can be removed altogether from the enclosure frame 106.

Now referring to FIGS. 4-9, specific features of a door assembly are shown. The features of the door assembly are discussed in connection with door assembly 10 of FIG. 1; however, it is understood that equivalent features could be incorporated into door assemblies adapted for use with enclosures of various sizes, including the enclosure 100 shown in FIG. 2. Additionally the features of the door assembly as illustrated in FIGS. 4-9 can be used either with or without use of a gasket, such as the gasket 116 shown in connection with FIG. 2, above.

Figure 4:
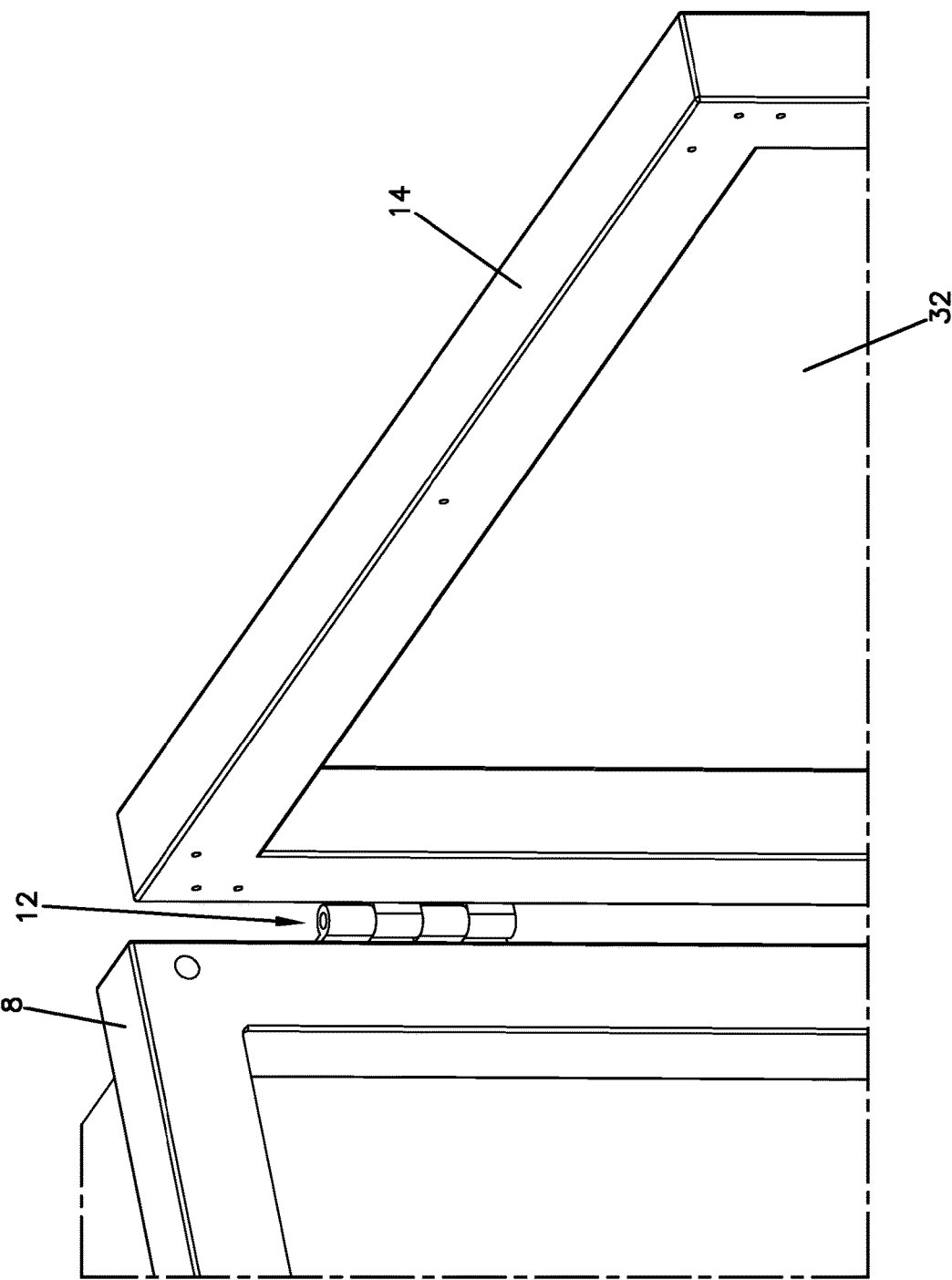
FIG. 4 illustrates an example embodiment of the enclosure door components of the arrangement of FIG. 1.

As shown in FIG. 4, in certain embodiments the structure of the door assembly 10 is comprised of a metal tubular door frame 14 to achieve high stiffness. Attached to the metal tubular door frame 14 is an outer wall 32, which may be welded to the metal tubular door frame 14.

Figure 5:
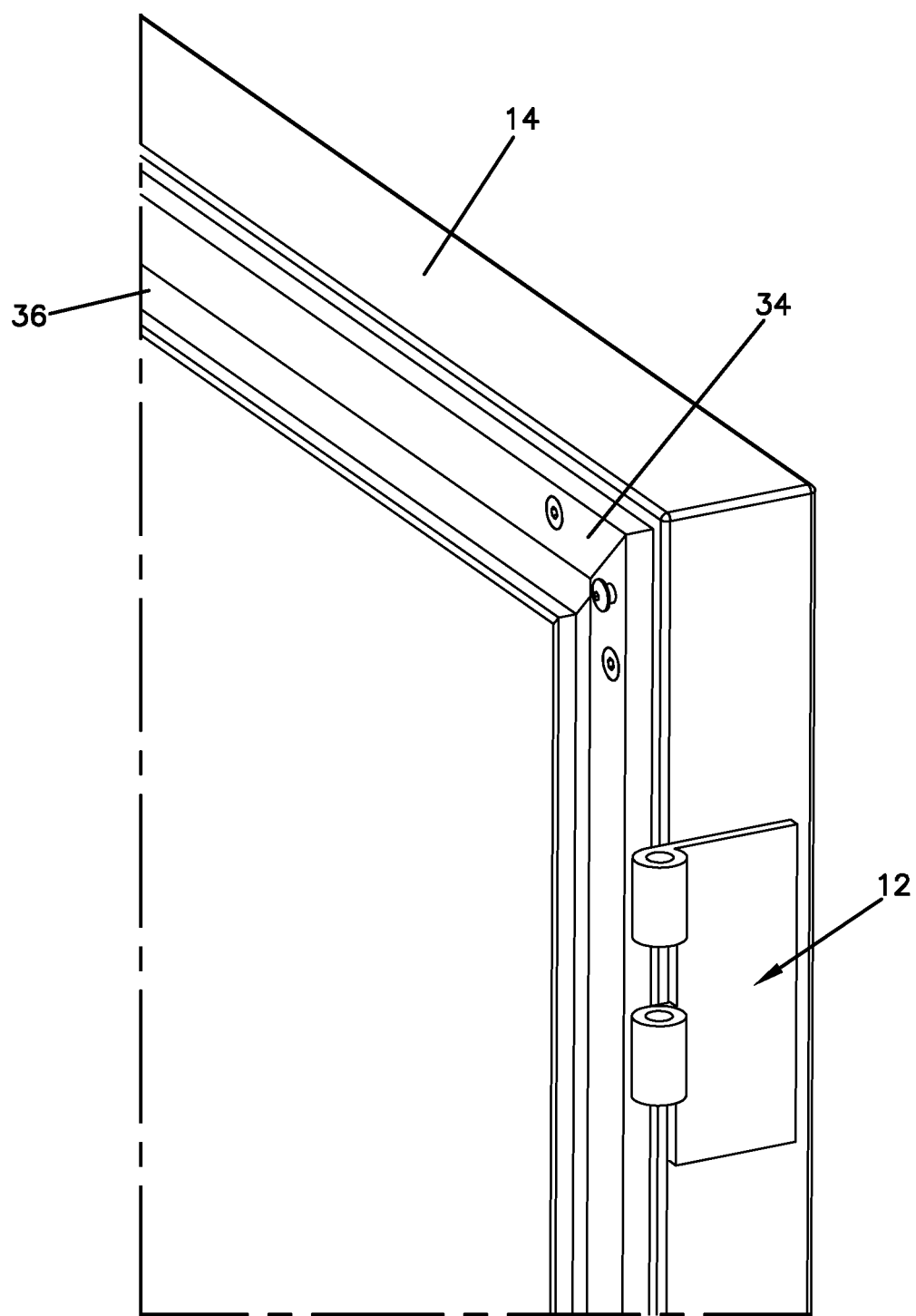
FIG. 5 illustrates a door tubular frame structure and a metal frame bracket.

FIG. 5 shows an extruded metal frame bracket 34 fastened to the metal door frame 14. In the embodiment shown, the frame bracket 34 is constructed from aluminum and has a channel 36 disposed around the perimeter of the frame bracket 34. However, in alternative embodiments, other materials could also be used. Still further, in some embodiments the structure of the metal frame bracket 34 can be incorporated into the metal tubular door frame 14 itself.

Figure 6:
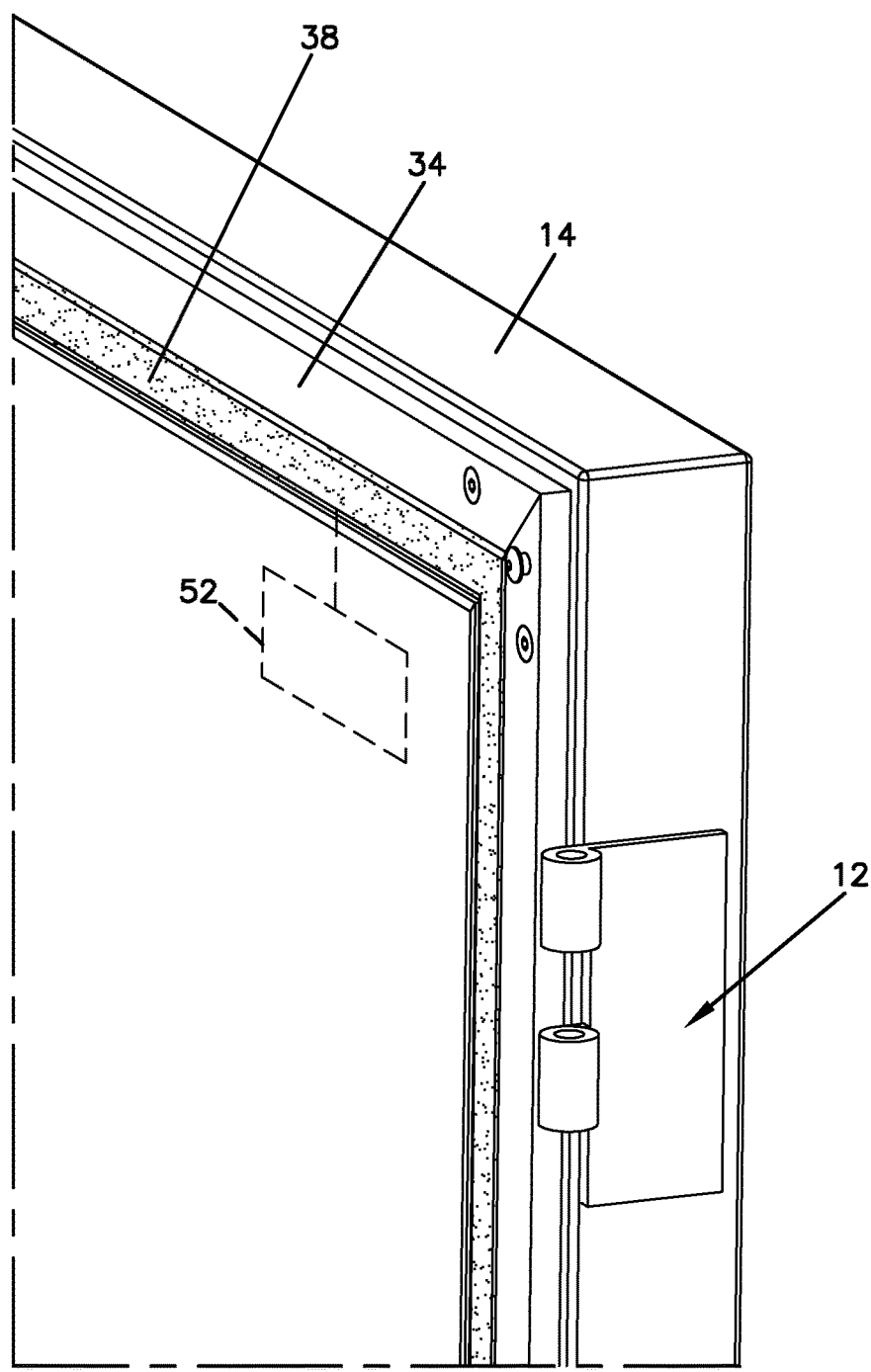
FIG. 6 shows the door assembly including an inflatable member.

In FIG. 6, an inflatable member 38 is shown positioned within the channel 36. In some embodiments, the inflatable member 38 may be secured to the frame bracket 34 by glue or epoxy. In some embodiments the inflatable member 38 has a hollow central cavity, and is inflatable by an inflation device (e.g. device 52) or other means for pressurizing the inflatable member, such as a compressor or pressurized gas bottle. In some embodiments the inflation device can be a compressor connected to an external power source. In other embodiments disposable gas canisters can be used so that external power is not required to inflate the inflatable member. The compressor or pressurized gas bottle can be adapted to supply a fixed amount of compressed gas or air to ensure that the inflatable member 38 is not over inflated or under inflated. In certain embodiments, the inflatable member 38 will be inflated to 10 psi. In some embodiments, the compressor or pressurized gas bottle can be located inside of the shielded enclosure 2. For example, the compressor or pressurized gas bottle may be located inside the door frame 14, between the shielding curtain 16 and outer wall 32. In other embodiments, the compressor or pressurized gas bottle may be located external of the shielded enclosure 2.

Figure 7:
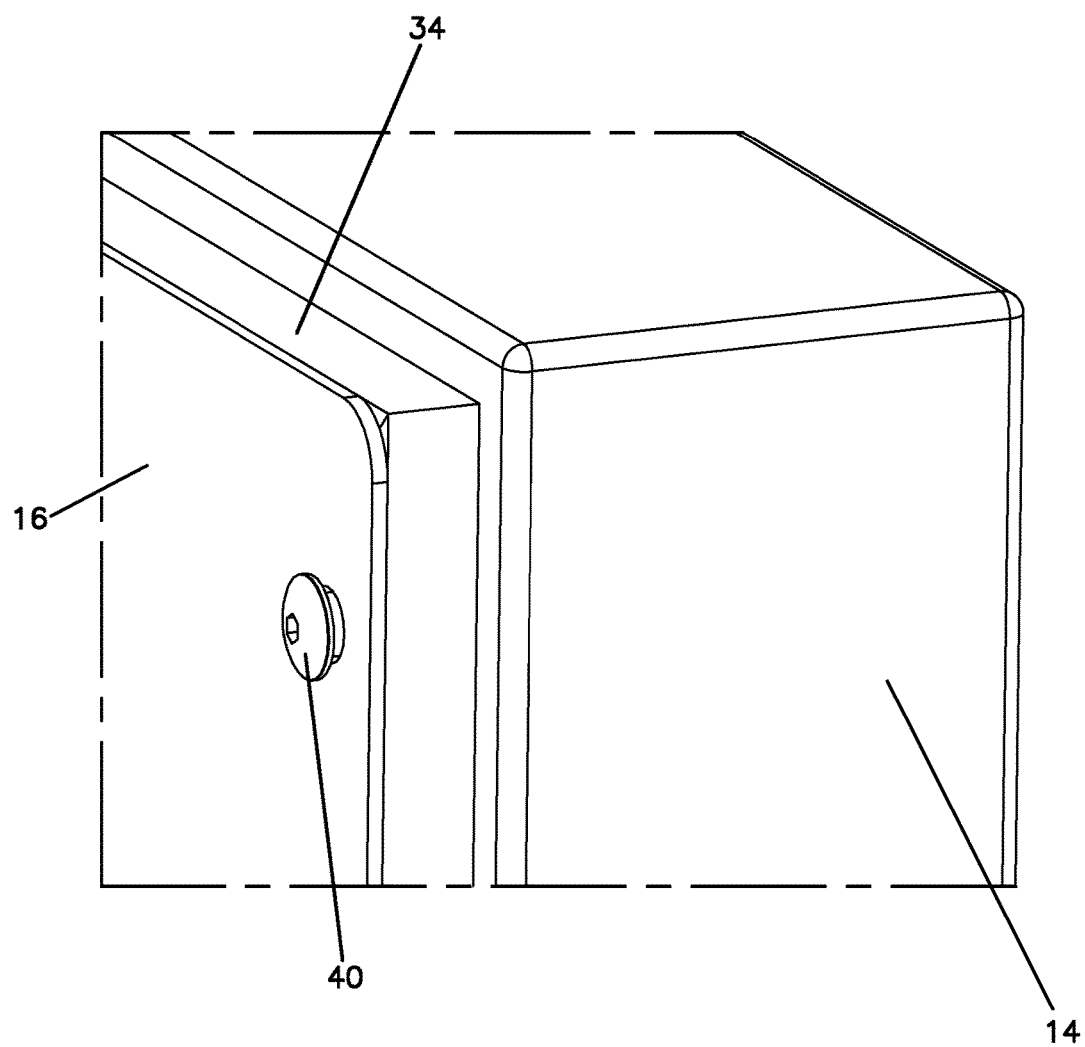
FIG. 7 shows the door components along with a shielding metal curtain hanging from hanger bolts.

FIG. 7 shows a shielding metal curtain 16 hanging from a plurality of hanging bolts 40 secured to the frame bracket 34. In certain embodiments the hanging bolts 40 include a threaded portion that can be threaded in the frame bracket 34 and a collar portion of which the metal curtain 16 is adapted to slide upon.

Figure 8:
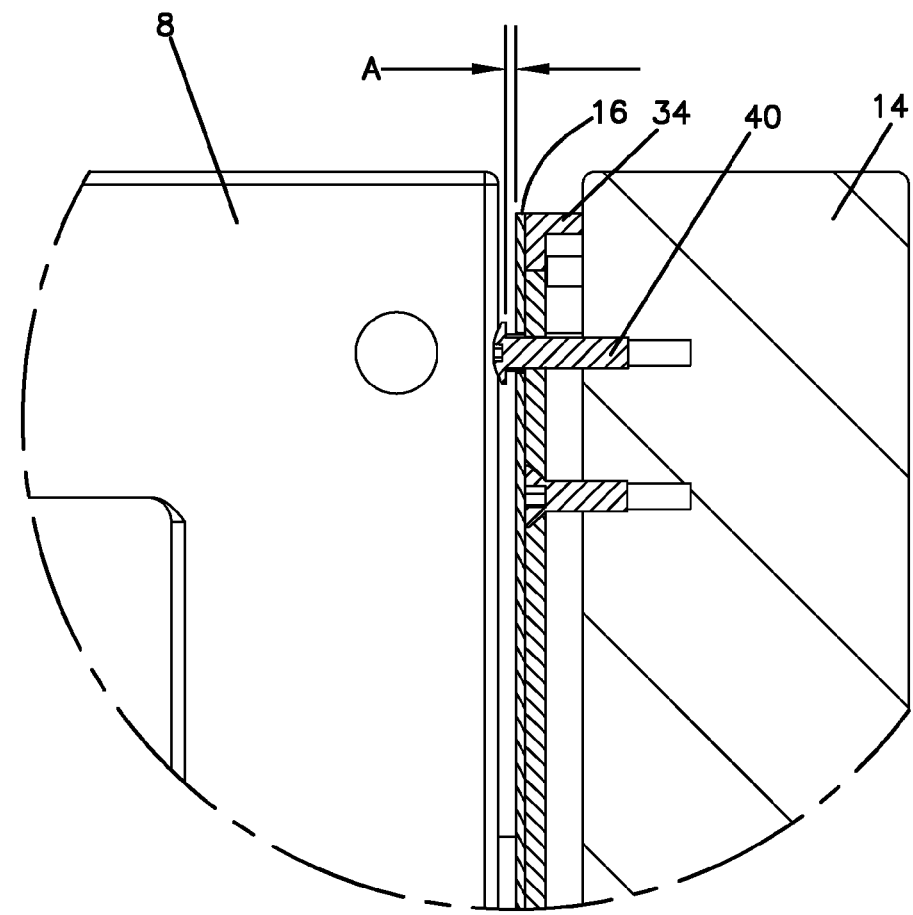
FIG. 8 shows a cross-sectional view of the door assembly.

FIG. 8 shows a cross-sectional view of the door assembly 10. When in their secured position, the hanging bolts 40 do not tightly press the metal curtain 16 against the frame bracket 34. Rather, the metal curtain 16 is free to slide upon the hanging bolt 40 over a distance A. In some embodiments the hanging bolts 40 may have a diameter smaller than that of the diameter of the holes in the metal curtain 16 so that the metal curtain may hang loosely on the hanging bolts 40. This particular sizing allows for the expanding and contracting of the metal curtain 16 in the event of temperature changes. In addition, by relaxing the tolerances between the hanging bolts 40 and the metal curtain 16, manufacturing becomes more affordable as the parts do not need to be as manufactured with a high degree of precision. In the preferred embodiment, the shielding metal curtain 16 is comprised of a flat metal sheet of steel that can be nickel coated to achieve low corrosion characteristics. A shielding metal curtain 16 is used to achieve a high attenuation seal around the entire perimeter of the door closure surface. It is noted that although metal curtain 16 is discussed in the context of FIG. 7, equivalent teachings are applicable to curtain 118 of FIG. 2.

In use, when the door assembly 10 and latch hinges 12 are in their respective closed positions, a user can activate the compressor or pressurized gas bottle to inflate the inflatable member 38. When inflated, the inflatable member 38 expands and forces the shielding metal curtain 16 over a distance A against the enclosure frame 8. Once the inflatable member 38 is inflated to the desired pressure the shielding metal curtain 16 is tightly pressed against the enclosure frame 8 with a uniform pressure around the door perimeter therefore sealing against the shielded enclosure 4.

As noted above, the enclosure frame 8 can be ground to form a smooth and planar outer surface for mating with the shielding curtain 16, such as by applying a surface grind operation. In addition, in some embodiments, the interior of the door frame 14 and the shielding curtain 16 may also be ground to have a smooth and planar surface to ensure effective mating between the door frame 14, the shielding curtain 16, and the enclosure frame 8. Surface finishes for the enclosure frame 8, the interior of the door frame 14, and the shielding curtain 16 can range from less than about 1 RMS to about 250 RMS. In some embodiments, less than about 1 RMS surface finish may be accomplished with electro-less nickel plating, electro polishing or other method. In such cases, the enclosure frame can be attached to the enclosure generally either prior to or after such a grinding process is performed. However, and with respect to mating of the shielding curtain 16 and enclosure frame 8 when the door assembly 10 is in a closed position, in example embodiments, the shielding curtain 16 can be at least partially flexible, such that, when the inflatable member 38 expands, the shielding curtain 16 can be at least partially deformed to seal against the enclosure frame 8.

Figure 9:
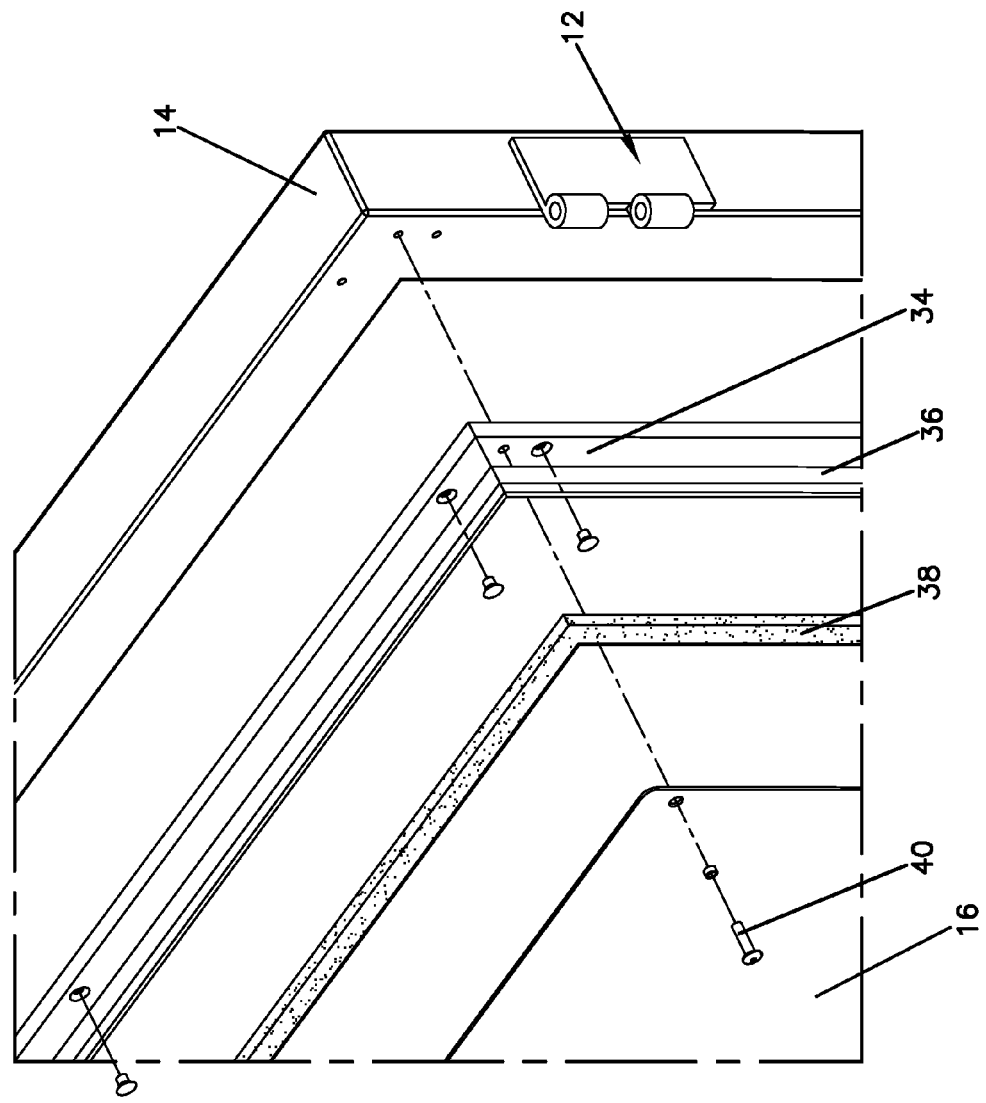
FIG. 9 shows an exploded view of the components of the shielding door assembly.

Shown in FIG. 9 is an exploded view of the complete door assembly 10. The frame bracket 34 is attached to the door frame 14. The inflatable member 38 is positioned inside the channel 36 of the frame bracket 34. Attached to the frame bracket is metal shielding curtain 16 by way of hanging bolts 40.

Referring to FIGS. 1-9 generally, it is noted that, in the context of the present disclosure, the protective enclosures described herein are designed to accommodate a level of manufacturing variability, in that differences in manufacturing that would cause misalignment of a door assembly and door opening (thereby possibly leaving open a gap through which such EMP or IEMI signals could pass) are accommodated by way of the adjustably-positioned inner door panel and, in general, the door assemblies 10, 108. This allows for creation of enclosures that would otherwise be too large to apply high-manufacturing tolerance techniques, such as a "skin cut" for flatness after fabrication.

In addition, and still referring to FIGS. 1-9 overall, some embodiments of the electromagnetically protected electronic enclosure described above may provide one or more of the following advantages. First, the enclosure can be produced with more relaxed manufacturing tolerances on the shielding curtain because the pressure from the inflatable member will seal the enclosure. Second, the enclosure is forgiving of large departures from flatness on the shielding enclosure, due to the adaptability of the inflatable member, shielding metal curtain, and optional gasket. Third, the manufacturing costs may be lower than other electromagnetic protection enclosures, for example due to simple manufacturability. Fourth, various alternative sizes of doors or door frames are possible. Still other advantages may exist.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A shielding arrangement for electronic equipment, the shielding arrangement comprising:
   a shielding enclosure having an interior volume, the interior volume defining a protected portion, the shielding enclosure further having one open side;
   an enclosure frame welded to the open side of the shielding enclosure;
   a door assembly having an opened and closed position, the door assembly providing access to at least the protected portion of the shielding enclosure and being secured to the enclosure, the door assembly including:
      a metal frame;
      a metal outer wall;
      a shielding curtain moveably attached to the metal frame; and
      an inflatable member positioned along a perimeter of the metal frame and between the metal frame and the shielding curtain, the inflatable member selected and positioned to, when inflated, apply a uniform pressure to the shielding curtain toward the enclosure frame to form a seal when the door assembly is in the closed position.

2. The shielding arrangement of claim 1, wherein the door assembly is configured to be secured to the enclosure with at least one hinge.

3. The shielding arrangement of claim 1, wherein a seal is created when the door assembly is in the closed position, the seal being maintained at least in part by inflating the inflatable member.

4. The shielding arrangement of claim 1, further comprising an electrical filter positioned at least partially outside of the protected portion, the electrical filter configured to dampen and diminish electromagnetic signals outside a predetermined acceptable range.

5. The shielding arrangement of claim 1, further comprising a power filter positioned at least partially outside of the protected portion, the power filter configured to receive an unfiltered power signal from external to the metallic enclosure and pass a filtered power signal through the electromagnetically shielding barrier to the protected portion.

6. The shielding arrangement of claim 1, further comprising a means for pressurizing the inflatable member.

7. The shielding arrangement of claim 6, wherein the means for pressurizing the inflatable member comprises at least one of: a compressor or a pressurized gas bottle.

8. The shielding arrangement of claim 1, further comprising a gasket disposed on the enclosure frame and surrounding the open side.

9. The shielding arrangement of claim 8, wherein the gasket is positioned between the curtain and the enclosure frame to contact the shielding curtain and assist in forming the seal when the door assembly is in a closed position.

* * * * *